United States Patent

Morrison

[11] 4,165,480
[45] Aug. 21, 1979

[54] PROSPECTING SYSTEM USING ROTATING SUPERCONDUCTING ELECTROMAGNETIC DIPOLE

[75] Inventor: H. Frank Morrison, Berkeley, Calif.
[73] Assignee: The Regents of the University of California, Berkeley, Calif.
[21] Appl. No.: 859,477
[22] Filed: Dec. 12, 1977
[51] Int. Cl.² ............................................. G01V 3/08
[52] U.S. Cl. ........................................ 324/6; 324/8; 335/216
[58] Field of Search ................................ 324/1, 3–8, 324/248; 335/216; 336/DIG. 1

[56] References Cited
U.S. PATENT DOCUMENTS

| | | | |
|---|---|---|---|
| 1,960,028 | 5/1934 | Ricker | 324/6 |
| 2,428,155 | 9/1947 | Guyod | 324/6 |
| 3,187,252 | 6/1965 | Hungerford | 324/6 |
| 3,431,495 | 3/1969 | Kolbert | 324/4 X |
| 3,561,007 | 2/1971 | Gouilloud et al. | 324/5 |
| 3,829,768 | 8/1964 | Nicol et al. | 324/8 X |
| 3,836,841 | 9/1974 | Morrison | 324/5 |
| 4,084,209 | 4/1978 | Hilal et al. | 335/216 X |

Primary Examiner—Gerard R. Strecker
Attorney, Agent, or Firm—Flehr, Hohbach, Test, Albritton & Herbert

[57] ABSTRACT

A prospecting system uses a rotating superconducting electromagnetic source which is swept over a frequency range with a magnetometer type receiver sensing the induced field. The effective dipole is rotated in a horizontal plane parallel to the ground surface with the sensed induced magnetic field being in the vertical axis.

6 Claims, 6 Drawing Figures

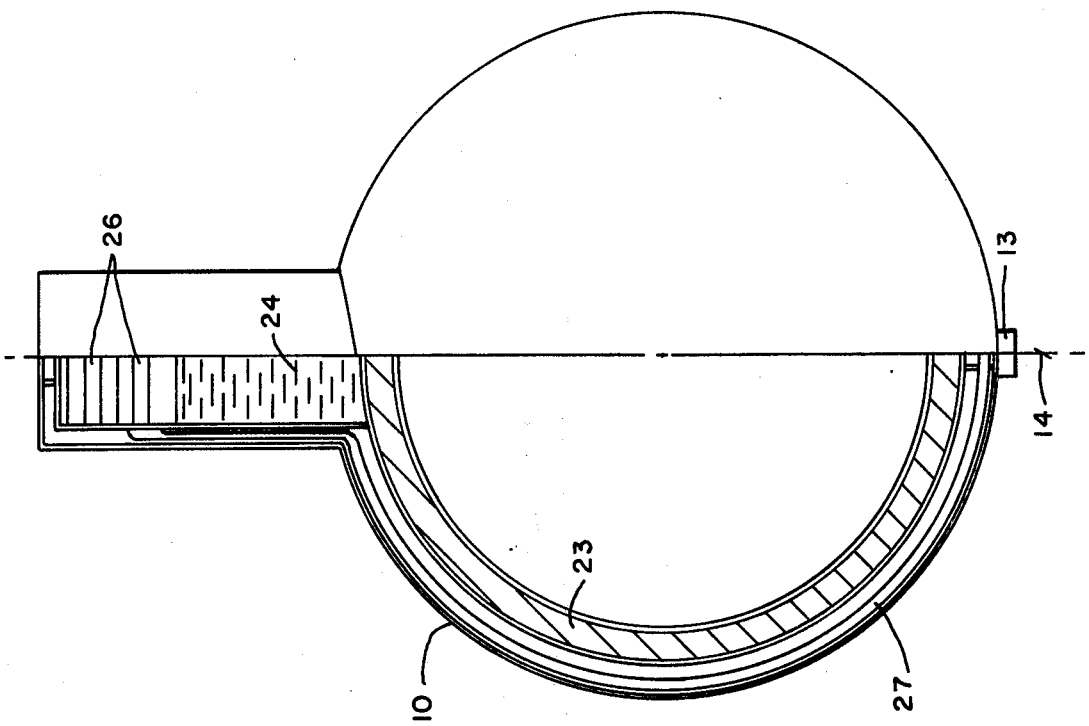
FIG.—2
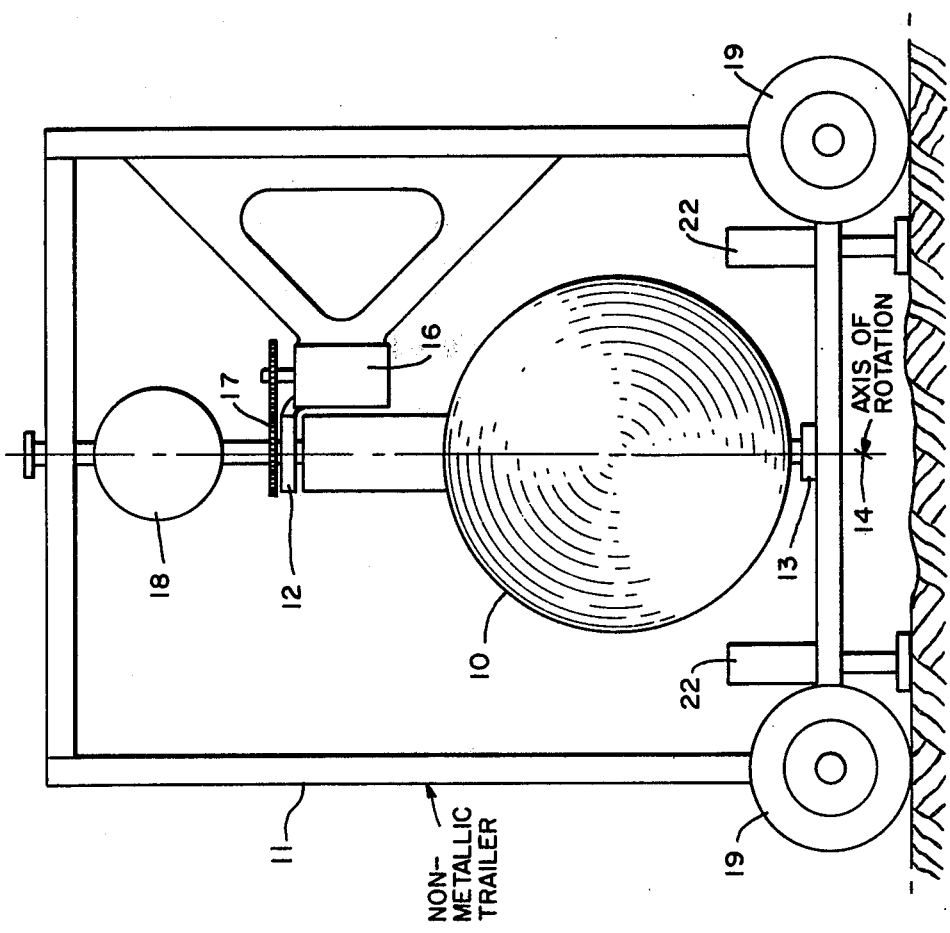
FIG.—1

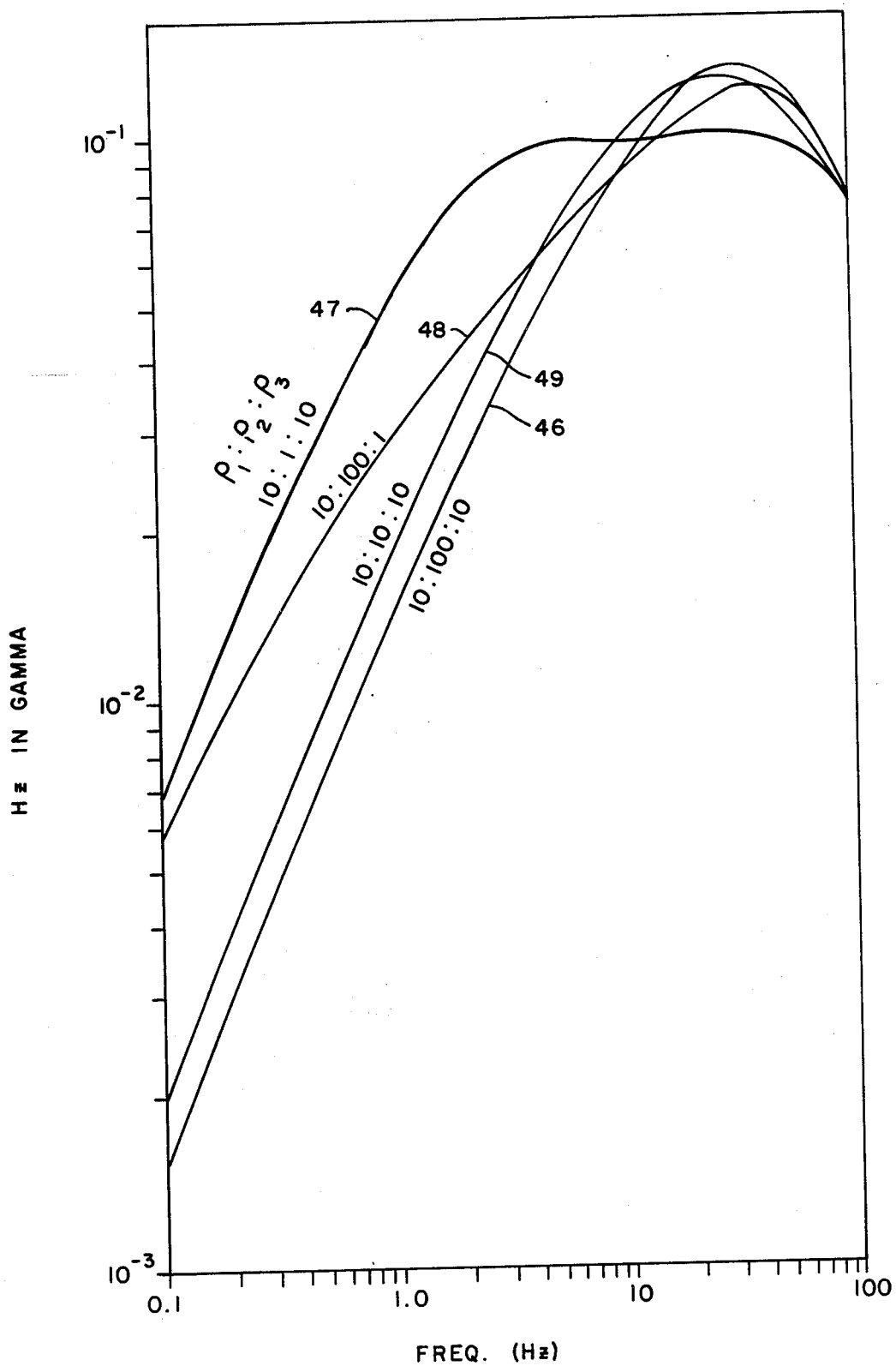
FIG.—5A

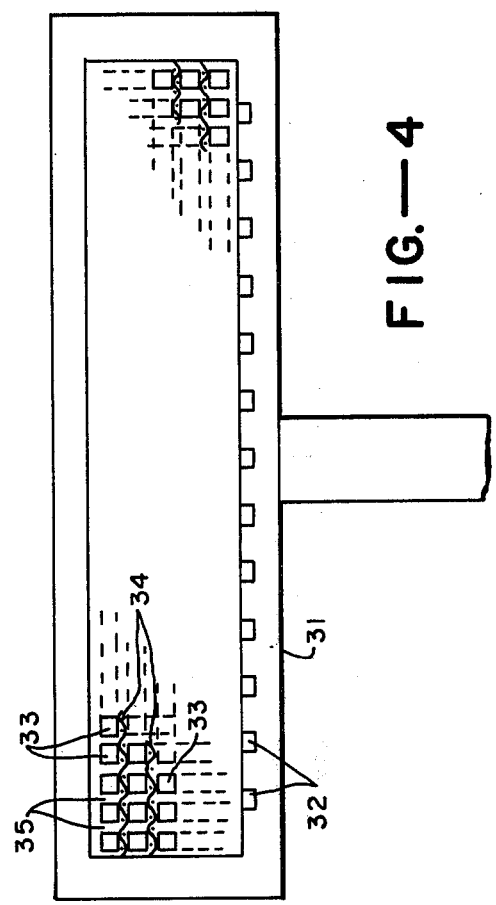
FIG.—4
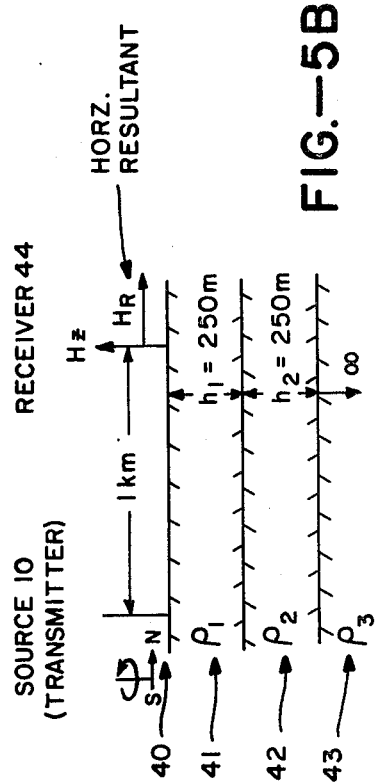
FIG.—5B
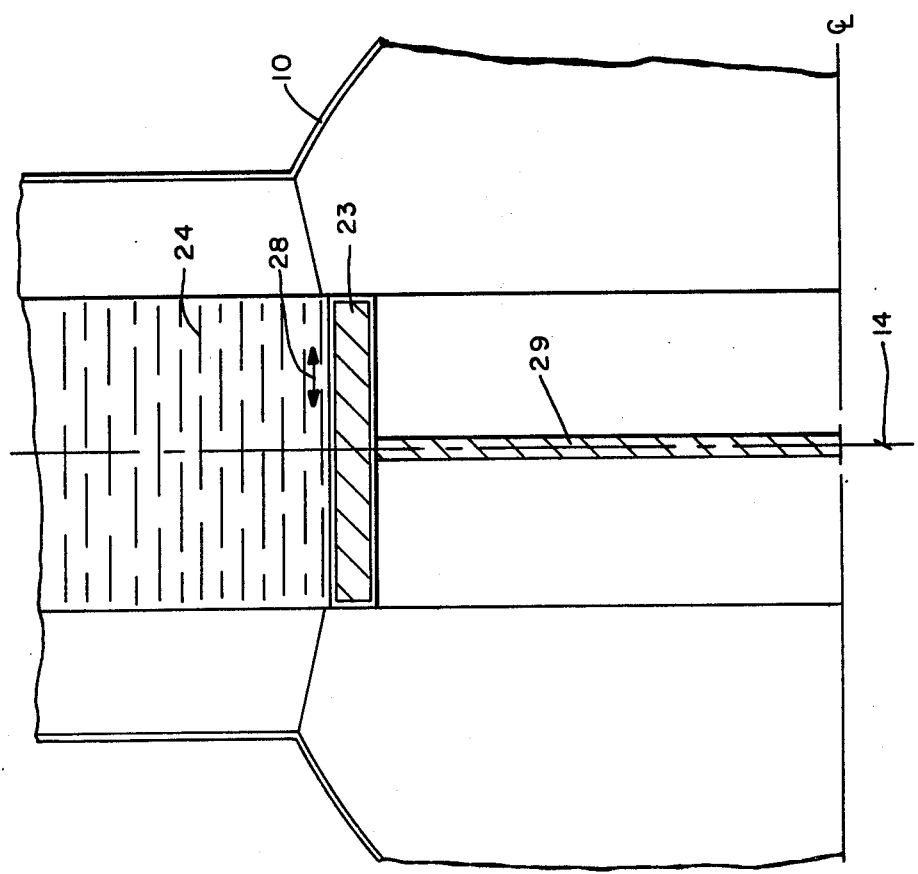
FIG.—3

PROSPECTING SYSTEM USING ROTATING SUPERCONDUCTING ELECTROMAGNETIC DIPOLE

BACKGROUND OF THE INVENTION

The present invention is directed to a prospecting system and more specifically to the determination of subsurface resistivity to locate both mineral deposits and geothermal systems and in general to delinate zones of contrasting electrical resistivity that may be used to determine geological structures favorable to the accumulation of petroleum, ground water or natural gas.

Electromagnetic techniques have been used to determine subsurface resistivity which include the use of either an insulated wire grounded at each end and driven by an alternating current source or a multiturn loop of wire (magnetic dipole) also driven with alternating current to induce currents in the ground under the theory of Faraday's law. Such induced fields were detected either with a grounded wire, with a sensitive magnetometer or an induction coil.

The theory of the response of a conductive earth to simple dipole sources is relatively old. Quasi-static solutions have been made for one and two layer earths. In general, theoretical papers have presented complete electric and magnetic field solutions for vertical and horizontal magnetic dipoles and horizontal electric dipoles on the surface of N layered half spaces. The solutions are presented either in the frequency domain or in the time, or transient, domain.

Electromagnetic techniques have seen their greatest practical implementation in Western countries in airborne and ground exploration at relatively shallow depths (for example, less than 300 meters) for mineral exploration. These surveys are largely qualitative in the sense that distortions of the electromagnetic field cause by buried resistivity inhomogenities are detected. Such a system is illustrated in U.S. Pat. No. 3,836,841 in the name of the present inventor.

Deeper and more quantitative electromagnetic soundings, with correspondingly lower frequencies of operation (for example, 0.01 Hz to 100 Hz) have been used extensively for petroleum exploration in the Soviet Union.

Other methods have been used to measure the electrical resistivity to depths of several kilometers. DC sounding, for example, as used by the Schlumberger Corporation makes use of a system in which dc current is injected into the ground between two electrodes and the voltages produced are detected on a second distant pair of electrodes. The depth of exploration depends on the separation of these current and voltage electrodes. There is great difficulty in sounding to great depths; viz, the spacing required becomes so large that lateral changes in geology invariably invalidate the assumptions used in interpreting the data in terms of a horizontally layered model.

Another method, magnetotelluric (MT) makes use of the fact that the ratio of the natural low frequency electric, E, and magnetic, H, fields at the surface of the earth can be used to infer the resistivity as a function of depth in the earth. This method is also very sensitive to lateral resistivity variations and moreover accurate data is difficult to obtain due to the presence of local noise sources in either E or H which contaminate the natural fields.

The controlled source electromagnetic techniques avoid the problems associated with the above two techniques. However, there have been several practical problems in conducting successful exploration projects with them. Principally, there is the problem of generating strong enough fields at low frequency to penetrate to the depths required and to be measurable by sensitive detectors. The only commercial application in the U.S. (by Group Seven Inc. of Denver, Colo.) uses the grounded wire source. To permit the injection of sufficient current, up to 500 amperes, large electrode pits must be machine dug and up to two or three kilometers of heavy cable used with a 600 kilowatt generator. This source is obviously not convenient to emplace or move, it is often difficult to arrange permission for its emplacement, and it also presents a safety hazard in some cases. Finally, there are areas of high surface electrical resistivity where the electrode contact resistance cannot be reduced and sufficient source current cannot be injected.

In summary it has been realized that electro-magnetic techniques are useful in the exploration for petroleum, geothermal resources and deeply buried mineral deposits. Existing systems are difficult to use and, thus, an effective electromagnetic system is desirable which is of a relatively lightweight field transportable design and uses a loop source (magnetic dipole) so that no electrode contacting problems can arise.

OBJECTS AND SUMMARY OF THE INVENTION

It is, therefore, a general object of the present invention to provide an improved electromagnetic prospecting system suitable for low frequency operation in the search for petroleum, geothermal and mineral resources.

In accordance with the above object there is provided a prospecting system with a direct current superconducting electromagnet for producing a dipole field. Means position the electromagnet close to a ground surface and continuously rotate its dipole around a predetermined axis. Sensing means spaced from the electromagnet and close to the ground surface measure a predetermined component of the field in the ground induced by the rotating electromagnet.

BRIEF DESCRIPTION OF THE DRAWINGS

FIG. 1 is a simplified elevational view of the electromagnetic source of the present invention;

FIG. 2 is a partial cross-sectional front view of a portion of the superconductive magnet of FIG. 1;

FIG. 3 is a partial side view of FIG. 2;

FIG. 4 is an enlarged cross-sectional view of a portion of FIG. 3;

FIG. 5A is a set of curves useful in understanding the present invention; and

FIG. 5B relates to the curves of FIG. 5A and is a simplified cross-section of ground being prospected along with the prosecting system of the present invention shown diagrammatically on the surface of the ground.

DETAILED DESCRIPTION OF THE PREFERRED EMBODIMENT

Referring now to FIG. 1, a direct current superconducting electromagnetic for producing a dipole field is contained within the sphere 10. The sphere is mounted for continuous rotation in a nonmetallic trailer frame 11 on the bearings 12 and 13 which rotate about a vertical axis of rotation 14. The drive motor 16 is provided with appropriate gearing 17 to variably drive the sphere 10 between, for example, 0.6 and 600 revolutions per minute. The stationary liquid helium reservoir 18 is mounted in the frame 11 to provide the superconductive properties of the rotating electromagnet contained in the sphere 10. The frame 11 is made into a portable trailer by wheels 19 the trailer including jacks 22 for maintaining stability during rotation of sphere 10.

FIG. 2 illustrates the cross-section of the superconducting coil 23 contained by sphere 10 which is a thin solenoidal coil one meter in diameter which is rotated about the axis 14 to form a torroidal cryostat. The coil is reduced to super-conducting temperature by the conduction of heat in the coil to the vertical axis of liquid helium storage unit 24. Such unit includes heat shields 26 which extend around the aluminum sphere in the inner space indicated at 27. FIG. 3 illustrates a side view of FIG. 2 showing the limited width dimension 28 of the coil 23 and an appropriate stress member 29 in the axis of rotation 14.

The specific coil form is shown in greater detail in FIG. 4 which consists of 13,000 terms of niobium titanium of 10.0 mil diameter wire which is designed to a persistent current of several hundred amperes. Rectangular aluminum coil form 31 is illustrated with helium cooling passages 32. Specific wires 33 are illustrated which are separated in layers by fiberglass cloth 34 with the other axis 35 being filled with epoxy. The weight of the wire in the system is only 40 kg with the total cryostat at 200 kg. The motor drive is approximately ½ kilowatt. This is compared to a prior horizontal loop system where for the same magnetic moment where 30 kg of wire and 15 kilowatts of energy are required for a 30 meter diameter loop.

The rotating supercooled dc electromagnet provided by the present invention allows magnetic moments (turns, area, current product, NAI) as high as $10^7$ MKS. A normal ac electromagnet could not be produced because of the ac loss phenomena in super conductors which would result in excessive cooling requirements. However, in the present invention which is used at relatively low frequencies, for example 0.01 Hz to one 10 Hz, a lossless dc superconducting magnet can easily be used and then rotated to produce the desired ac inducing field. This concept has the following significant advantages.

1. The resultant dipole field can be oriented in any direction; in particular, the horizontal direction which has significant signal to noise advantages.

2. A spinning dipole actually produces an elliptically polarized field at a distant point which is advantageous in resolving two dimensional resistivity distributions.

3. The rotation can be very accurately controlled because of its relatively light weight and the magnetic moment is a true invariant so that no reference for moment strength is required--only phase information is needed for absolute measurement.

4. The magnetic moment is essentially limited only by the maximum size and the cyrostat that can be transported. Moments of $10^8$ on a nonmetallic trailer are thus feasible.

5. There is no joule heating loss. This is the major energy loss in conventional systems.

6. The system is easily transportable since there are no loops to lay out.

Conventional permanent magnetic materials such as the trademark ALNICO or some of the newer samarium cobalt magnets will reach unmanagable weights for moments over $10^6$. This means they would be suitable only for shallow exploration systems using higher frequencies and smaller moments.

The system of the present invention is easily amenable to swept frequency operation. Thus the induced fields can be measured as a continuous function of frequency over the band of interest. In practice the coil of permanent magnet would be accelerated slowly to a maximum RPM, for example, 600 and then decelerated at the same rate. Such rotation is monitored to provide a reference for synchronous detection at the receiver. The receiving system might typically be a SQUID type magnetometer manufactured by S.C.T. Inc. of Mountain View, Calif. or S.H.E. Inc. of San Diego, Calif. The practical implementation of a SQUID in a field electromagnetic program is well-known; for example, with a weight of 25 pounds and operating on self-contained batteries.

Operation

FIGS. 5A and 5B illustrate the operation of the invention. FIG. 5B shows a simple model of a three layer earth with a ground surface 40, the first layer 41 with a resistivity of $\rho_1$ and a depth of $h_1$, a second layer 42 having a resistivity of $\rho_2$ and depth of $h_2$, and a third layer 43 having resistivity of $\rho_3$ with an undefined depth.

The curves of FIG. 5A relate to depths of the first and second layers where $h_1$ equals 250 meters and $h_2$ equals 250 meters. The horizontal axis of the curve is frequency from 0.1 Hz to 100 Hz and the vertical axis is magnetic field strength in gamma units. Moreover, the magnetic field is in a vertical direction, $H_Z$.

The supercooled rotating dc magnetic transmitter 10 is illustrated in FIG. 5B with its north-south poles rotating in a horizontal plane. A receiver 44 is shown which may be a magnetometer which in the present case is sensitive only to the $H_Z$ direction. The other field is illustrated as $H_R$ which is resultant of the X and Y directions in the horizontal plane. In the example shown the receiver 44 is located approximately one kilometer from the source 10 since the depth of investigation is approximately one kilometer. The transmitter is started at a relatively low frequency of 0.01 Hz and swept to 10.0 Hz.

FIG. 5A shows the sensed vertical magnetic field produced by the rotating magnetic dipole source of the present invention for three representative geologic models. Curve 46 shows a resistive intermediate layer, curve 47 a conductive intermediate layer and curve 48 a resistive intermediate layer ($\rho_2$) underlined by a layer ($\rho_3$) ten times as conductive as the surface layer ($\rho_1$). The last curve 49 assumes a uniform resistivity of 10 ohm meters in the half space determined by the ground. The sensed magnetic field values have been theoretically calculated for an assumed source magnetic dipole moment of $10^6$. Since the sensitivity of commercially available SQUID magnetometers is on the order of $10^{-5}$ gamma, it is evident from FIG. 5A that the resultant induced magnetic fields are easily measured.

In all of these models the values of the resultant magnetic field $H_Z$ approach the same value at high frequency. This is because the fields cannot penetrate deeply enough to be affected by the underlying rocks at these frequencies. However, at the lower frequencies the models are quite different in that the layering results in significant departures from the response that would have been obtained if the ground had a uniform resistivity equal to that of the first layer.

Specifically in the case of curve 47, the conductive second layer field amplitude, $H_Z$, at one Hz is approximately $5 \times 10^{-2}$ gammas as compared to the value of $1.8 \times 10^{-2}$ gammas for the uniform half space curve 49. On the other hand, the presence of a more resistive intermediate layer, curve 46, has a much smaller effect reducing the vertical magnetic field to approximately $1.5 \times 10^{-2}$ gammas. Thus, with proper analyzation of the curves of FIG. 5A, a suitable resistivity model of the ground can be obtained.

In comparison, in dc sounding in order to sound to great depths the spacing required becomes so large that lateral changes in geology invariably occur and invalidate the simple layer assumption. These effects are much reduced with an electromagnetic sounding system as in the present invention in which the transmitter-receiver separation may be kept at the same value as the depth being investigated.

The present invention has an important advantage over the natural field magnetotelluric method. In the latter, noise contamination can occur which is of a kind which cannot be removed by mere averaging of the data. Arbitrary noise reduction can be achieved with the present invention by using longer averaging periods.

Furthermore the present invention has an important advantage over all previous loop source methods. It has been shown theoretically that for a horizontal loop source (vertical magnetic dipole) the sensed field in the horizontal direction is the most sensitive to the subsurface resistivity distribution. Unfortunately the horizontal direction is also that of the maximum component of the natural field signals that constitute the noise for electromagnetic field detection. However, by a theorem of reciprocity, in the case of a vertical loop source (horizontal magnetic dipole) it is the sensed magnetic field in the vertical direction which is the most diagnostic. The natural fields in the vertical direction may be expected to be a factor of ten less than these in the horizontal direction. Thus for one configuration of the present invention a signal to noise improvement of 10 to one can be effected by using an orientation not possible with large loop conventional sources.

Other electromagnetic systems can be envisioned using this source. Detectors which measure the polarization of the sensed field would eliminate the need for an accurate phase link between transmitter and receiver. Rather than the synchronous detector described in the present embodiment a cross correlation scheme could be used to determine the transfer function of the earth.

A method using two magnetic sensors could be used in which the more remote sensor could be used to provide a cancellation signal for the natural field noise present in the detector near the dipole source. This scheme makes use of the fact that the magnetic field noise is uniform over many tens of kilometers but the signal from the dipole source falls off inversely with the cube of the distance from the source.

Electric fields could be measured at the distant observation point in addition to the sensed magnetic fields. The magnetic susceptibility of the ground, or of inhomogenieties in the ground (such as ore bodies) could be determined by measuring the in-phase magnetic field at very low frequencies where only magnetic induction occurs rather than electromagnetic Faraday induction. The latter would be useful in distinguishing permanent from induced magnetization sources for observed dc magnetic field anamolies.

Thus, an improved portable prospecting system has been provided.

What is claimed is:

1. A prospecting system comprising: a direct current superconducting electromagnet for producing a dipole field; means for positioning such electromagnet close to a ground surface and continuously rotating said electromagnet and its resultant dipole around a predetermined axis; sensing means spaced from said electromagnet and close to said ground surface for measuring a predetermined component of the field in said ground induced by said rotating electromagnet.

2. A system as in claim 1 where said means for rotating includes means for varying the speed of rotation over a predetermined range.

3. A system as in claim 1 where said axis of rotation is perpendicular to said ground surface whereby said dipole is rotated in a horizontal plane.

4. A system as in claim 3 where said sensed field component is vertical.

5. A system as in claim 1 where said spacing of said sensing means from said electromagnet is the same order of magnitude as the depth below the ground surface being prospected.

6. A system as in claim 1 where said means for positioning and rotating said electromagnet is substantially nonmetallic.

* * * * *